United States Patent [19]
Jiang et al.

[11] Patent Number: 6,166,558
[45] Date of Patent: Dec. 26, 2000

[54] METHOD FOR MEASURING GATE LENGTH AND DRAIN/SOURCE GATE OVERLAP

[75] Inventors: Chun Jiang, San Jose; Wei Long; Zicheng G. Ling, both of Sunnyvale; Yowjuang W. Liu, San Jose, all of Calif.

[73] Assignee: Advanced Micro Devices, Inc., Sunnyvale, Calif.

[21] Appl. No.: 09/237,540

[22] Filed: Jan. 26, 1999

[51] Int. Cl.$^7$ .................................................. H01L 29/78
[52] U.S. Cl. ............................................................ 324/769
[58] Field of Search .................................... 324/765, 769, 324/719, 158.1, 659, 662, 663, 671; 257/48, 268, 335, 408, 320

[56] References Cited

U.S. PATENT DOCUMENTS

| | | | |
|---|---|---|---|
| 5,194,923 | 3/1993 | Vinal | 257/268 |
| 5,268,318 | 12/1993 | Harari | 257/320 |
| 5,600,578 | 2/1997 | Fang et al. | 324/769 |

OTHER PUBLICATIONS

U.S. application No. 09/237,539, Wei Long, Yowjuang W. Liu, Chun Jiang., filed Jan. 26, 1999.
On the Accuracy of Channel Length Characterization of LDD MOSFET's Jack Y. –C. Sun, Matthew R. Wordeman, Stephen E. Laux, 1986, 7 pages (month unavailable).
An Accurate Gate Length Extraction Method for Sub–Quarter Micron MOSFET's, Cheng–Liang Huang, John V. Faricelli, Dimitri A. Antoniadis, Nadim A. Khalil, Rafael A. Rios, 1996, 6 pages (month unavailable).
A Problem–Specific Inverse Method for Two–Dimesional Doping Profile Determination from Capacitance–Voltage Measurements, G. J. L. Ouwerling, 1991, 18 pages (month unavailable).
The Extraction of Two–Dimensional MOS Transistor Doping via Inverse Modeling, Nadim Khalil, John Faricelli, David Bell, Siegfried Selberherr, 1995, 3 pages (month unavailable).
A New "Shift and Ratio" Method for MOSFET Channel–Length Extraction, Yuan Taur, D.S. Zicherman, D.R. Lombardi, Phillip J. Restle, C.H. Hsu, Hussein I. Hanafi, Matthew R. Wordeman,Bijan Davari, Ghavam G. Shahidi, 1992, 3 pages.
CMOS Circuit Design, Layout, and Simulation, R. Jacob Baker, Harry W. Li, David E. Boyce, 1997, 5 pages (month unavailable).
A New Capacitance Measurement Method for Lateral Diffusion Profiles in Mosfet's with Extremely Short Overlap Regions, H. Uchida, Y. Kajita, K. Fukada, J. Ida, N. Hirashita, K. Nishi, publication date unknown, 2 pages (month unavailable).

*Primary Examiner*—Vinh P. Nguyen
*Attorney, Agent, or Firm*—Lariviere, Grubman & Payne, LLP

[57] ABSTRACT

The invention provides a method and apparatus for calculating gate length and source/drain gate overlap, by measuring gate capacitance. The invention uses previously known fringe capacitance $C_{fr}$ and unit capacitance $C_{OX}$. The invention measures gate capacitance $C_g$, when the gate is accumulatively biased, and solves for overlap capacitance $C_{OV}$ using the equation $C_{OV}=(C_g-2C_{fr})/2$ or $C_{OV}=(C_{gg}-C_{gb}-2C_{fr})/2$. The invention then measures the gate capacitance $C_g$ when the gate to source/drain voltage is set to inversion bias and a zero voltage is applied between the source/drain and the substrate, and solves for the channel capacitance $C_{ch}$ using the equation $C_{ch}=C_g-2C_{fr}-2C_{OV}$. The invention calculates the channel capacitance $C_{ch}$ where $C_{ch}=C_g-2C_{fr}-2C_{OV}$ and then calculates gate length where gate length $L_g=(2C_{OV}+C_{ch})/C_{OX}$ and the effective gate length $L_{eff}=C_{ch}/C_{OX}$. The invention further calculates source/drain gate overlap $L_{OV}$, by setting $L_{OV}=C_{OV}/C_{OX}$.

19 Claims, 4 Drawing Sheets

6,166,558

METHOD FOR MEASURING GATE LENGTH AND DRAIN/SOURCE GATE OVERLAP

TECHNICAL FIELD

The present invention relates to integrated circuits and fabrication inspection techniques. More particularly, the present invention relates to integrated circuits and fabrication inspection techniques that facilitate the measurement of gate length (polysilicon Critical Dimension (poly CD)) and drain/source gate overlap.

BACKGROUND OF THE INVENTION

The prior art measures a current created by an applied voltage to measure gate length and drain/source gate overlap for MOSFET's.

As the miniaturization of MOS devices continues accurate production measurements of gate length and drain/source gate overlap become more important. The prior art measures the current resulting from an applied voltage to measure the gate length and drain/source gate overlap. Examples of the prior art, using traditional IV methods are discussed in papers entitled "On the Accuracy of Channel Length Characterization of LDD MOSFET's", IEEE Transactions on Electron Devices, Vol. 33, No. 10 (October 1986), which also discusses the accuracy problems in the prior art, and "A New 'Shift and Ratio' Method for MOSFET Channel-Length Extraction", IEEE Electron Device Letters, Vol. 13, No. 5 (May 1992). "An Accurate Gate Length Extraction Method for Sub-Quarter Micron MOSFET's", IEEE Transactions on Electron Devices, Vol. 43, No. 6 (June 1996), discloses a prior art method using SEM or TEM, which destroys the gate being tested and a CV method which requires a numerical simulation, which is too complicated.

Using the capacitance generated by an applied voltage as practiced by the invention will provide more accurate, simpler and nondestructive measurements of the gate length and drain/source overlap in a manufacturing environment, where a simple and inexpensive method is desired for quality control.

BRIEF SUMMARY OF THE INVENTION

Accordingly, the foregoing object is accomplished by providing a method and device for measuring gate length (poly CD) and drain/source gate overlap by measuring the gate capacitance. The drain/source gate overlap $L_{OV}$ is the distance by which either the drain or source overlaps with the gate. The gate length (poly CD ($L_g$)) is the length of the gate from one end to the other.

BRIEF DESCRIPTION OF DRAWINGS

For fuller understanding of the present invention, reference is made to the accompanying drawing in the following Detailed Description of the Invention. In the drawings.

Figure 1:
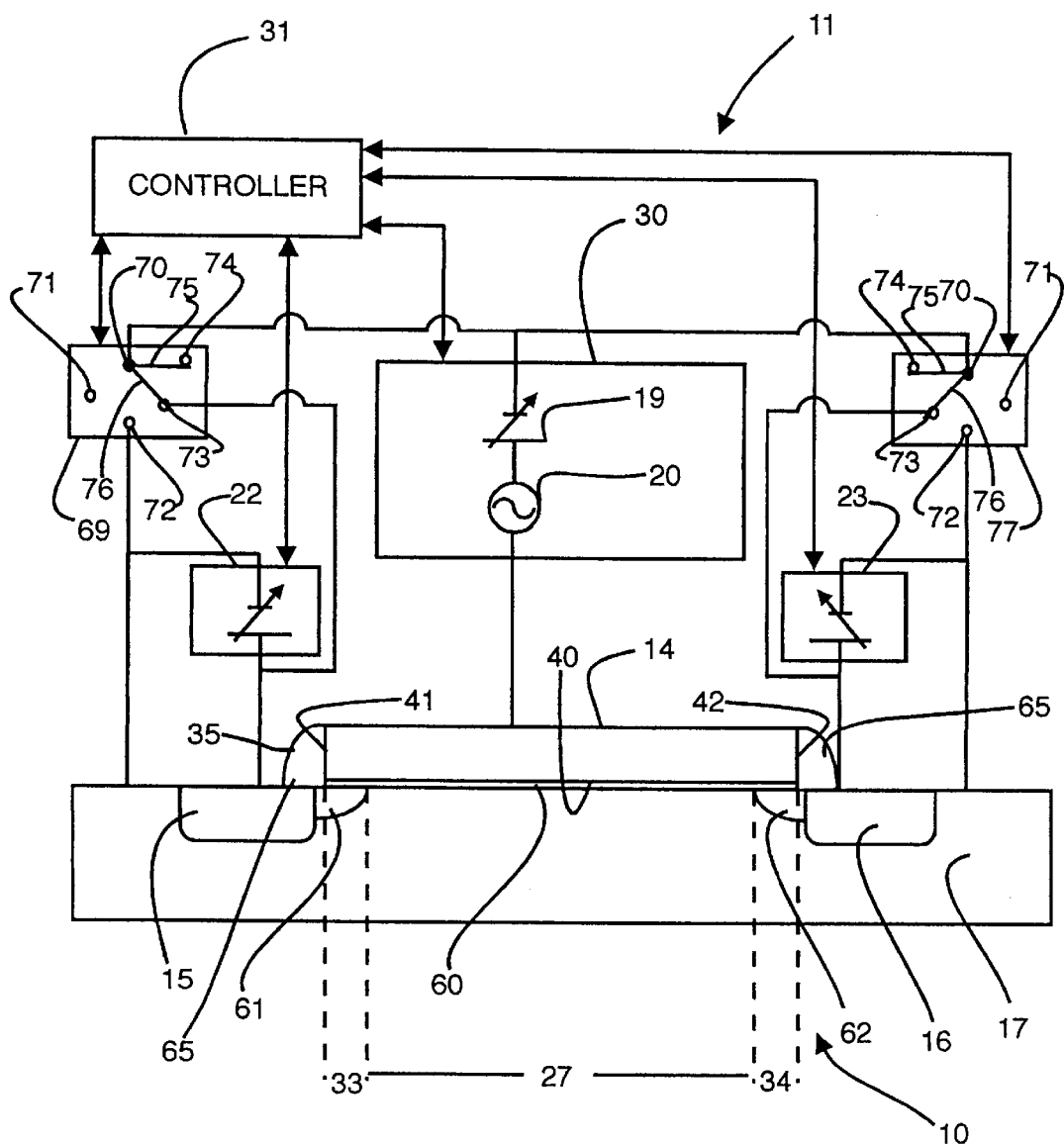
FIG. 1 is a cross-sectional view of a MOS transistor and an a schematic of a measurement device electrically connected to the MOS transistor.

Reference numbers refer to the same or equivalent parts of the present invention throughout the several figures of the drawing.

DETAILED DESCRIPTION OF THE INVENTION

FIG. 1 depicts a MOS transistor 10 attached to a testing device 11 used to practice the invention. The MOS transistor 10 comprises a gate 14, a source 15, and a drain 16 mounted on a substrate 17. The gate 14 is separated from the substrate 17 by a thin insulating layer 60, which is formed by a thin oxide layer. Spacers 65 are placed on opposite ends of the gate 14. A source extension 61 extends from the source 15 to a point under the gate 14 so that the gate 14 overlaps with part of the source extension 61 by a source overlap length 33. A drain extension 62 extends from the drain 16 to a point under the gate 14 so that the gate 14 overlaps with part of the drain extension 62 by a drain overlap length 34. An effective gate length 27 ($L_{eff}$) extends from an end of the source extension 61 to an end of the drain extension 62, so that the gate length ($L_g$) is the sum of the drain overlap length 34, the source overlap length 33, and the effective gate length 27.

The gate 14 has a substrate side 40 which is the side of the gate that is closest to the substrate 17. A source end 41 of the gate 14 is an end of the gate that is adjacent to the substrate side 20 and the source extension 61. A drain end 42 of the gate 14 is an end of the gate that is adjacent to the substrate side 20 and the drain extension 62.

The test device 11 uses an LCR meter 30. The LCR meter has a variable DC power source 19 and a AC source 20 in series with the DC source 19. A source variable DC power supply 22 is electrically connected between the source 15 and the substrate 17, and a drain variable DC power supply 23 is electrically connected between the drain 16 and the substrate 17. A controller 31 is electrically connected to the LCR meter 30, the source variable DC power supply 22, and the drain variable DC power supply 23. In the preferred embodiment a precision LCR meter (e.g. HP 4284 A) is used as a combined LCR meter 30 and controller 31 in single unit.

A source switch 69 comprises a reference contact 70 electrically connected to the LCR meter variable power source 19. The source switch 69 further comprises a first wiper 75 and a second wiper 76, where the first wiper 75 and second wiper 76 form a fixed angle and are mounted to be electrically connected to and to rotate around the reference contact 70. The source switch 69 has a first 71, a second 72, a third 73 and a fourth 74 contact. The first wiper 75 and the second wiper 76 electrically connect the reference contact 70 to two of the first, second, third, or fourth contacts 71, 72, 73, or 74 at one time, where the connected contacts are adjacent to each other. The first contact 71 and the fourth contact 74 are isolated (or floating) contacts not connected to a circuit. The second contact 72 is electrically between the substrate 17 and the source variable DC power supply 22, as shown if FIG. 1. The third contact 73 is electrically connected to the source 15. The source switch 69 is electrically connected to and controlled by the controller 31.

A drain switch 77 comprises a reference contact 70 electrically connected to the LCR meter variable power source 19. The drain switch 77 further comprises a first wiper 75 and a second wiper 76, where the first wiper 75 and second wiper 76 form a fixed angle and are mounted to be electrically connected to and to rotate around the reference contact 70. The drain switch 77 has a first 71, a second 72, a third 73 and a fourth 74 contact. The first wiper 75 and the second wiper 76 electrically connect the reference contact 70 to two of the first, second, third, or fourth contacts 71, 72, 73, or 74 at one time, where the connected contacts are adjacent to each other. The first contact 71 and the fourth contact 74 are isolated (or floating) contacts not connected to a circuit. The second contact 72 is electrically between the substrate 17 and the drain variable DC power supply 23, as shown if FIG. 1. The third contact 73 is electrically connected to the drain 16. The drain switch 77 is electrically connected to and controlled by the controller 31.

In operation, large area gate capacitors (e.g. 100×100 μm) are employed to determine by experimentation the capacitance per unit of length $C_{OX}$ of the type of gate being measured. The capacitance per unit length $C_{OX}$ is entered into the controller 31. Throughout the measurements, a calibration structure is employed to zero out all the parasitic capacitances due to probing pad and wiring. By using HP4284 LCR Meter the resolution of the measurement setup is better than 0.1 fF.

Figure 2:
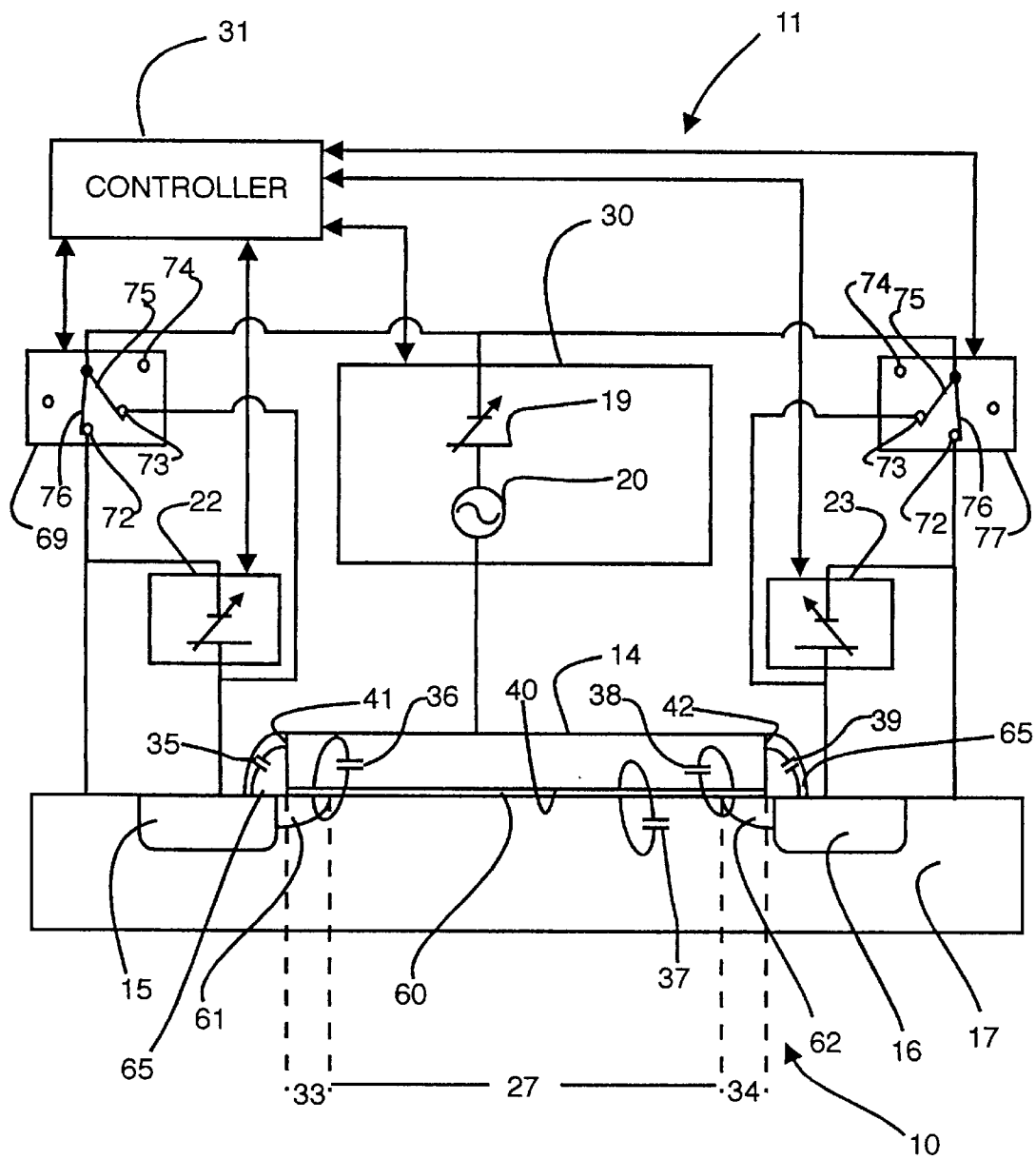
FIG. 2 is a schematic illustration of the MOS transistor illustrated in FIG. 1, schematically showing different sources of capacitance.

When a voltage is applied to the gate 14, it causes a change in the gate capacitance $C_g$, which can be measured by the LCR meter. The gate capacitance $C_g$ is the sum of smaller capacitances that contribute in parallel to the gate capacitance $C_g$. FIG. 2 schematically illustrates these smaller capacitances. These smaller capacitances are the fringe capacitance $C_{fr}$ from the source end 35, which is the fringe capacitance generated between the source end 41 of the gate 14 and the source 15 and source extension 61; the overlap capacitance $C_{OV}$ from the source 36, which is the capacitance generated between the gate 14 and the source extension 61 over the source overlap length 33; the channel capacitance $C_{ch}$ 37, which is the capacitance generated between the gate 14 and the substrate 17 over the distance between the source extension 61 and the drain extension 62; the overlap capacitance $C_{OV}$ from the drain 38, which is the capacitance generated between the gate 14 and the drain extension 62 over the drain overlap length 34; and the fringe capacitance $C_{fr}$ from the drain end 39, which is the fringe capacitance between the drain end 42 of the gate 14 and the drain 16 and drain extension 62. The fringe capacitance from the source end 35 is equal to the fringe capacitance from the drain end 39. The overlap capacitance of the source 36 is equal to the overlap capacitance of the drain 38. Therefore, $C_g=2C_{fr}+2C_{OV}+C_{ch}$ (equation 1).

The value for the fringe capacitance $C_{fr}$ can be determined using different applied gate voltages $V_g$ and substrate voltages $V_{sub}$. This is done by measuring $C_g$ (the capacitance between the gate and the source) versus $V_b$ (the voltage at which the substrate is biased) at several different gate voltages $V_g$. $C_{fr}$ can be determined from the cross-point of $C_g$ vs $V_b$ to the depletion end. Another method of measuring the fringe capacitance $C_{fr}$ is by simulation using the Medici two dimensional simulation with input parameters of gate oxide thickness, poly gate thickness and poly doping density. $C_{fr}$ remains approximately constant at different gate voltages. The determination of the fringe capacitance is further discussed in the paper entitled "A New Capacitance Measurement Method For Lateral Diffusion Profiles In MOSFET's With Extremely Short Overlap Regions", by H Uchida et al.

In the specification and claims, stating that a voltage is applied between the gate 14 and the source 15 and the same voltage is applied between the gate 14 and the drain, will be notated as the voltage is applied between the gate 14 and the source/drain 15, 16. In the same way, stating that a voltage is applied between the substrate 17 and the source 15 and the same voltage is applied between the substrate 17 and the drain, will be notated as the voltage is applied between the substrate 17 and the source/drain 15, 16. In addition, stating that the capacitance $C_g$ is measured between the gate 14 and the source/drain 15, 16 shall mean that the capacitance $C_g$ is measured between the gate 14 and the source 15 or the gate 14 and the drain 16, since in these measurements these capacitances are equal. A gate to source and drain and substrate capacitance is a gate to source/drain/substrate capacitance. Likewise a gate to source and drain and substrate voltage is a gate to source/drain/substrate voltage.

In a preferred method of operation, the controller 31 signals the source switch 69 and the drain switch 77 to be set so that the first wiper 75 electrically connects the reference contact 70 with the fourth contact 74 and the second wiper 76 electrically connects the reference contact 70 with the third contact 73, as shown in FIG. 1. The controller 31, also, signals the drain variable DC power supply 23 to ground the drain 16 to the substrate 17, and the source variable DC power supply 22 to ground the source 15 to the substrate 17, so that the voltage applied between the source/drain 15, 16 and the substrate 17 $V_S$ is equal to 0. The controller 31 also signals the variable DC power source 19 of LCR meter 30 to apply a non-zero inversion voltage $V_g$ between the gate 14 and the source/drain 15, 16 and use the AC source 20 of the LCR meter 30 to measure the gate capacitance $C_g$, which is recorded by the controller 31. The controller 31 keeps the settings of the source switch 66 and the drain switch 77 unchanged and then signals the variable DC power source 19 of the LCR meter 30 to apply the voltage $-V_g$ between the gate 14, the source/drain 15, 16 and the source/drain variable DC power supplies 22, 23 to ground the source/drain 15, 16 to the substrate 17, so that the voltage applied between the source/drain and the gate 14 is equal to $-V_g$. The AC source 20 of the LCR meter 30 is used to measure the gate capacitance $C_g$, which is recorded. Since the gate 10 is isolated to the substrate 17, which is in accumulation under $-V_g$, the channel capacitance $C_{ch}$ equals zero, and equation 1 above is reduced to $C_g=2C_{fr}+2C_{OV}$ (equation 2).

Plugging $C_{fr}$ into equation 2 when, yields $C_{OV}=(C_g-2C_{fr})/2$ (equation 3). Since $C_{OV}$ remains approximately constant at reversed gate voltages, we can plug both $C_{OV}$ and $C_{fr}$ into equation 1, when the gate voltage is $V_g$ and solve for the channel capacitance $C_{ch}$. Large area gate capacitors (100×100 μm) are employed to determine by experimentation the capacitance per unit of length $C_{OX}$. Using these measured values, the drain/source overlap length $L_{OV}$ is calculated using the equation $L_{OV}=C_{OV}/C_{OX}$. The gate length $L_g$ (poly CD) is calculated using the equation $L_g=(2C_{OV}+C_{ch})/C_{OX}=(C_g-2C_{fr})/C_{OX}$. The effective gate length $L_{eff}$ is calculated using the equation $L_{eff}=(C_g-2C_{OV})/C_{OX}$.

Figure 3:
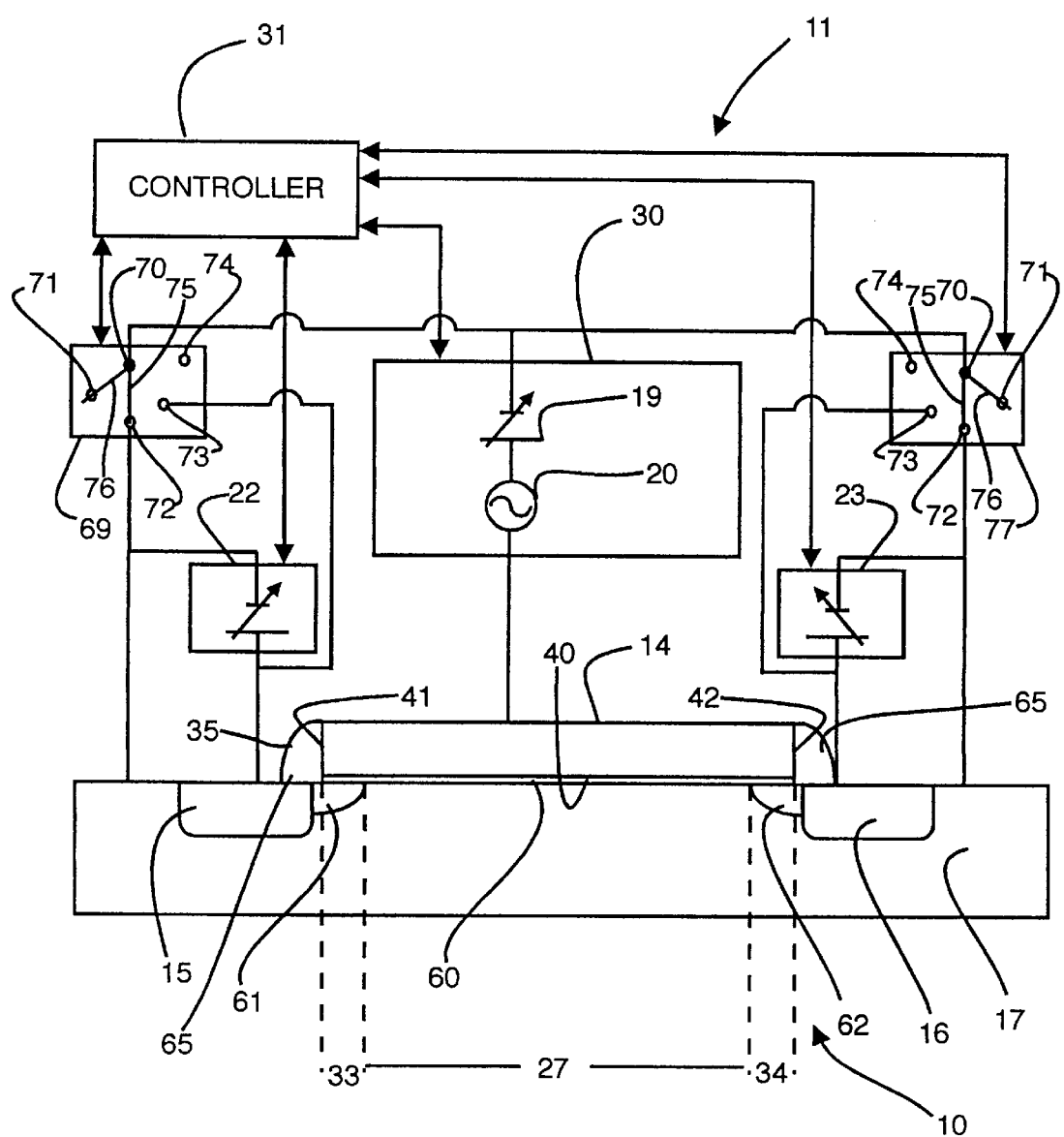
FIG. 3 is a view of the MOS transistor and measurement device illustrated in FIG. 1, set at a different setting.
Figure 4:
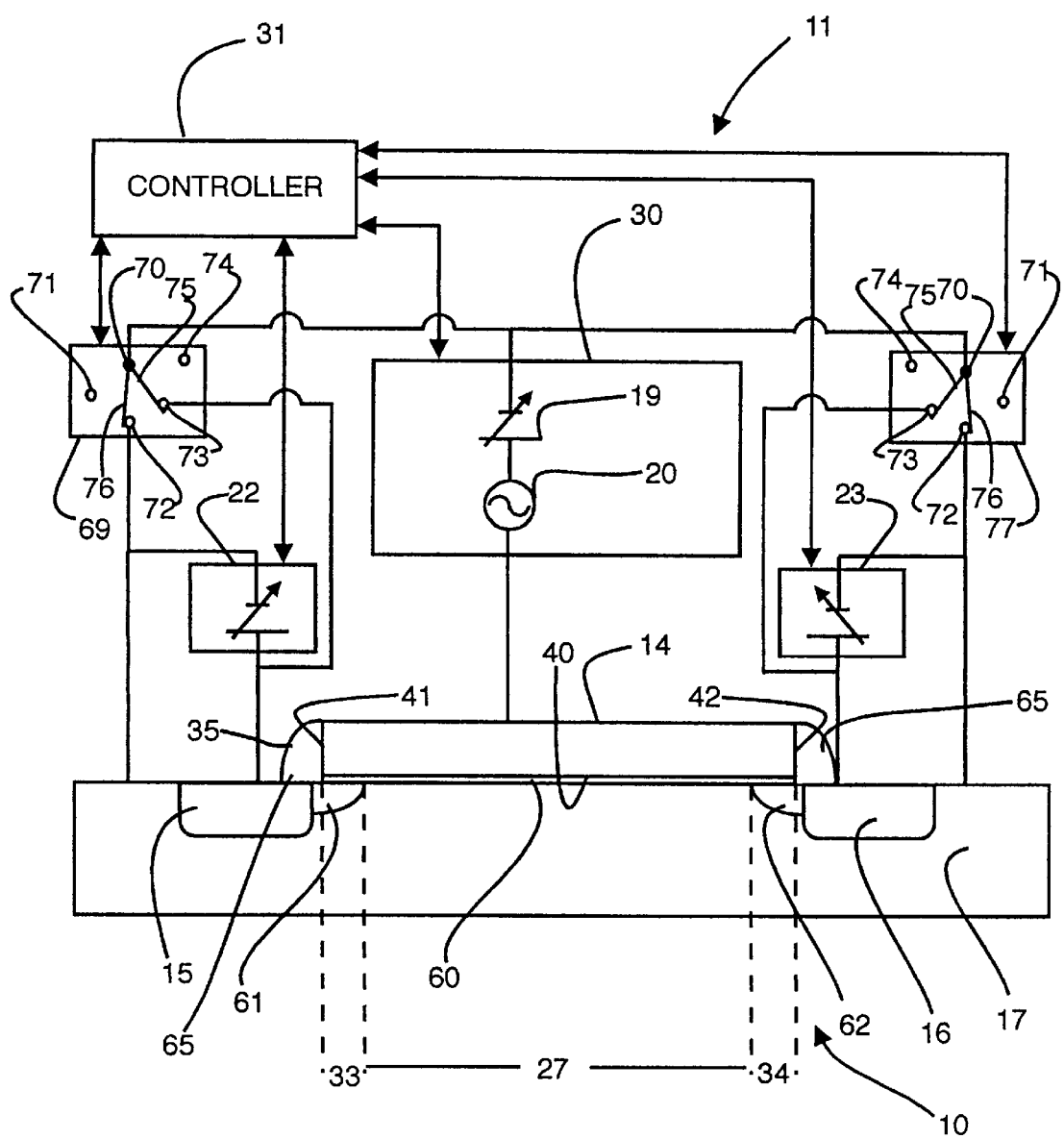
FIG. 4 is a view of the MOS transistor and measurement device illustrated in FIG. 1, set at a different setting.

In another preferred method of obtaining $C_g=2C_{fr}+2C_{OV}+C_{ch}$ is to have the controller 31 signal the source switch 69 and the drain switch 77 to be set so that the first wiper 75 electrically connects the reference contact 70 with the second contact 72 and the second wiper 76 electrically connects the reference contact 70 with the first contact 71, as shown in FIG. 3. The controller 31, also, signals the drain variable DC power supply 23 to ground the drain 16 to the substrate 17, and the source variable DC power supply 22 to ground the source 15 to the substrate 17, so that the voltage applied between the source/drain 15, 16 and the substrate 17 $V_S$ is equal to 0. The controller 31 also signals the variable DC power source 19 of LCR meter 30 to apply a non-zero inversion voltage $-V_g$ between the gate 14 and the source/drain 15, 16 and use the AC source 20 of the LCR meter 30 to measure the gate capacitance, which in this case is actually the gate to substrate capacitance $C_{gb}$, which is recorded by the controller 31. The controller 31 then signals the source switch 69 and the drain switch 77 to be set so that the first wiper 75 electrically connects the reference contact 70 with the third contact 73 and the second wiper 76 electrically connects the reference contact 70 with the second contact 72, as shown in FIG. 4. The controller 31 signals the variable DC power source 19 of the LCR meter 30 to apply the voltage $-V_g$ between the gate 14 and the source 15, drain 16 and substrate 17 (source/drain/substrate), and use the AC source 20 of the LCR meter 30 to measure the gate capacitance, which in this case is actually the gate to source and drain and substrate (source/drain/substrate) capacitance $C_{gg}$, which is recorded by the controller 31. Equation 1 is then reduced to $C_{gg}-C_{gb}=2C_{fr}-2C_{OV}=C_g$.

The present invention has been particularly shown and described with respect to a certain preferred embodiment and features thereof. However, it should be readily apparent to those of ordinary skill in the art that various changes and modifications in form, semiconductor material, material conductivity type, and detail may be made without departing from the spirit and scope of the inventions as set forth in the appended claims. The inventions illustratively disclosed herein may be practiced without any element which is not specifically disclosed herein.

What is claimed is:

1. A method for measuring the gate length $L_g$ of a transistor gate comprising a gate, a source, and a drain mounted on a substrate and with a known fringe capacitance $C_{fr}$ and a known unit capacitance $C_{OX}$, comprising the steps of:

applying a nonzero inversion gate voltage $V_g$ between the gate and the source/drain;

applying a zero voltage between source/drain and the substrate;

measuring the gate capacitance $C_g$ between the gate and the source/drain with a LCR meter; and calculating gate length where gate length $L_g=(2C_{OV}+C_{ch})/C_{OX}=(C_g-2C_{fr})/C_{OX}$.

2. The method, as recited in claim 1, further comprising the steps of:

applying an accumulation voltage $-V_g$ between the gate and the source/drain and a zero voltage between the source/drain and the substrate;

measuring the gate capacitance $C_g$ between the gate and the source/drain with an LCR meter; and calculating the overlap capacitance $C_{OV}$, where $C_{OV}=(C_g-2C_{fr})/2$.

3. The method, as recited in claim 2, wherein the step of calculating the gate length, comprises the step of calculating the channel capacitance $C_{ch}$ where $C_{ch}=C_g-2C_{fr}-2C_{OV}$, and further comprising the step of calculating the channel effective length $L_{eff}=C_{ch}/C_{OX}$.

4. The method, as recited in claim 3, further comprising the step of calculating source/drain gate overlap $L_{OV}$, where $L_{OV}=C_{OV}/C_{OX}$.

5. The method, as recited in claim 4, further comprising the step of electrically connecting an LCR meter between the gate the source/drain.

6. The method, as recited in claim 1, further comprising the step of electrically connecting an LCR meter between the gate and the source/drain.

7. The method, as recited in claim 1, further comprising the steps of:

applying an accumulation voltage $-V_g$ between the gate and the source/drain and substrate;

measuring gate capacitance $C_{gb}$ between the gate and the substrate;

measuring gate to source/drain/substrate capacitance $C_{gg}$; and calculating overlap capacitance $C_{OV}$, where $C_{OV}=(C_{gg}-C_{gb}-2C_{fr})/2$.

8. An apparatus for measuring the gate length of a transistor gate comprising a gate, a source, and a drain mounted on a substrate and with a known fringe capacitance $C_{fr}$ and a known unit capacitance $C_{OX}$, comprising:

an LCR meter electrically connected between the gate and the source/drain;

a source variable DC power supply electrically connected between the source and the substrate;

a drain variable DC power supply electrically connected between the drain and the substrate;

a controller electrically connected to the LCR meter, the source variable DC power supply, and the drain variable DC power supply, wherein the controller comprises:

means for signalling the LCR meter to apply a non-zero inversion voltage $V_g$ between the gate and the source/drain;

means for signalling the source DC power supply to apply a zero voltage between the source and the substrate;

means for signalling the drain DC power supply to apply a zero voltage between the drain and the substrate;

means for signalling the LCR meter to measure the gate capacitance $C_g$ for the applied voltage $V_g$ between the gate and the source/drain;

means for storing the measured gate capacitance $C_g$;

means for signalling the LCR meter to apply a voltage $-V_g$ between the gate and the source/drain;

means for signalling the LCR meter to measure the gate capacitance $C_g$ for the applied voltage;

means for storing the measured gate capacitance $C_g$;

means for calculating the overlap capacitance $C_{OV}$;

means for calculating the channel capacitance $C_{ch}$ where $C_{ch}=C_g-2C_{fr}-2C_{OV}$ when the applied voltage between the gate and source/drain is $V_g$;

means for calculating gate length where gate length $L_g=(2C_{OV}+C_{ch})/C_{OX}$ when the applied voltage between the gate and source/drain is $V_g$; and means for calculating effective gate length $L_{eff}=C_{ch}/C_{OX}$ when the applied voltage between the gate and source/drain is $V_g$.

9. The apparatus, as recited in claim 8, wherein the controller further comprises means for calculating source/drain gate overlap $L_{OV}$, by setting $L_{OV}=C_{OV}/C_{OX}$.

10. The apparatus, as recited in claim 8, wherein the means for calculating $C_{OV}$, comprises the means for calculating $C_{OV}=(C_{gg}-C_{gb}-2C_{fr})/2$, when the applied voltage between the gate and the source/drain is $-V_g$.

11. The apparatus, as recited in claim 8, wherein the means for calculating $C_{OV}$, comprises the means for calculating $C_{OV}=(C_g-2C_{fr})/2$, when the applied voltage between the gate and the source/drain is $-V_g$.

12. A method for measuring the gate length $L_g$ of a transistor gate comprising a gate, a first source/drain, and a second source/drain mounted on a substrate, comprising the steps of:

measuring the fringe capacitance $C_{fr}$ of the transistor gate;

measuring the unit capacitance $C_{OX}$ of the transistor gate;

applying a zero voltage between the source/drain and the substrate;

applying a non-zero inversion voltage $V_g$ between the gate and the source/drain;

measuring the gate capacitance $C_g$ between the source/drain and the gate with the LCR meter;

applying non-zero accumulation voltage $-V_g$ between the source/drain and the gate;

measuring the gate capacitance $C_g$ between the source/drain and the gate with the LCR meter;

calculating the overlap capacitance $C_{OV}$;

calculating the channel capacitance $C_{ch}$ where $C_{ch}=C_g-2C_{fr}-2C_{OV}$ when the applied voltage between the gate and source/drain is $V_g$;

calculating gate length where gate length $L_g=(2C_{OV}+C_{ch})/C_{OX}$ when the applied voltage between the gate and source/drain is $V_g$; and calculating effective gate length $L_{eff}=C_{ch}/C_{OX}$.

13. The method, as recited in claim 12, further comprising the steps of calculating source/drain gate overlap $L_{OV}$, by setting $L_{OV}=C_{OV}/C_{OX}$.

14. The method, as recited in claim 13, further comprising the step of electrically connecting an LCR meter between the gate and the source/drain.

15. The method, as recited in claim 14, wherein the step of measuring the unit capacitance $C_{OX}$ comprises the step of measuring the capacitance of a large area gate capacitor.

16. The method, recited in claim 15, wherein the step of measuring the fringe capacitance $C_{fr}$, comprises the step of measuring the gate to source capacitance $C_{gs}$ versus substrate voltage $V_b$ at several different gate voltage $V_g$ values.

17. The method, recited in claim 15, wherein the step of measuring the fringe capacitance $C_{fr}$, comprises the performing a Medici two dimensional simulation.

18. The method as recited in claim 13, wherein the step of calculating $C_{OV}$, comprises the step of setting $C_{OV}=(C_g-2C_{fr})/2$ when the applied voltage between the gate and source/drain is $-V_g$.

19. The method as recited in claim 13, wherein the step of calculating $C_{OV}$, comprises the step of setting $C_{OV}=(C_{gg}-C_{gb}-2C_{fr})/2$ when the applied voltage between the gate and source/drain is $-V_g$.

* * * * *